(12) United States Patent
O'Brien et al.

(10) Patent No.: US 6,913,941 B2
(45) Date of Patent: Jul. 5, 2005

(54) SOI POLYSILICON TRENCH REFILL PERIMETER OXIDE ANCHOR SCHEME

(75) Inventors: Gary J. O'Brien, Gilbert, AZ (US); David J. Monk, Mesa, AZ (US)

(73) Assignee: Freescale Semiconductor, Inc., Schaumburg, IL (US)

(*) Notice: Subject to any disclaimer, the term of this patent is extended or adjusted under 35 U.S.C. 154(b) by 97 days.

(21) Appl. No.: 10/238,062

(22) Filed: Sep. 9, 2002

(65) Prior Publication Data

US 2004/0048410 A1 Mar. 11, 2004

(51) Int. Cl.⁷ .............................................. H01L 21/00
(52) U.S. Cl. .............................. 438/48; 438/50; 438/52
(58) Field of Search ..................................... 438/48–54

(56) References Cited

U.S. PATENT DOCUMENTS

| | | |
|---|---|---|
| 5,780,352 A | 7/1998 | Park et al. |
| 5,879,963 A * | 3/1999 | Howe et al. ............. 438/52 |
| 5,963,818 A | 10/1999 | Kao et al. |
| 6,307,298 | 10/2001 | O'Brien |
| 6,352,928 | 3/2002 | Tsutsui |
| 6,358,818 | 3/2002 | Wu |
| 6,359,299 | 3/2002 | Gruening |
| 6,368,912 | 4/2002 | Chang et al. |
| 6,368,941 | 4/2002 | Chen et al. |

* cited by examiner

Primary Examiner—H. Jey Tsai
(74) Attorney, Agent, or Firm—John A. Fortkort; Fortkort Grether + Kelton LLP

(57) ABSTRACT

A method for creating a MEMS structure is provided. In accordance with the method, a substrate (53) is provided having a sacrificial layer (55) disposed thereon and having a layer of silicon (57) disposed over the sacrificial layer. A first trench (59) is created which extends through the silica layer and the sacrificial layer and which separates the sacrificial layer into a first region (61) enclosed by the first trench and a second region (63) exterior to the first trench. A first material (65) is deposited into the first trench such that the first material fills the first trench to a depth at least equal to the thickness of the sacrificial layer. A second trench (71) is created exterior to the first trench which extends through at least the silicon layer and exposes at least a portion of the second region of the sacrificial layer. The second region of the sacrificial layer is contacted, by way of the second trench, with a chemical etching solution adapted to etch the sacrificial layer, said etching solution being selective to the first material.

26 Claims, 9 Drawing Sheets

SOI POLYSILICON TRENCH REFILL PERIMETER OXIDE ANCHOR SCHEME

FIELD OF THE INVENTION

The present invention relates generally to microfabrication techniques, and more particularly to methods for making an anchor for a MEMS device.

BACKGROUND OF THE INVENTION

Advancements in micromachining and other microfabrication techniques and processes have enabled the fabrication of a wide variety of MicroElectroMechanical Systems (MEMS) and devices. These include moving rotors, gears, switches, accelerometers, miniaturized sensors, actuator systems, and other such structures.

One popular approach for forming MEMS devices makes use of a modified wafer known as a Silicon-On-Insulator (SOI) wafer. An SOI wafer is essentially a silicon wafer having a silicon dioxide dielectric layer disposed thereon, and having a thin film of active single-crystalline silicon disposed on the dielectric layer.

FIGS. 1–3 illustrate a conventional method for creating a MEMS structure on an SOI wafer. As shown in FIG. 1, in accordance with this method, a silicon wafer substrate 15 is provided having a silicon dioxide dielectric layer 13 disposed thereon. A layer of active single crystal silicon 11 is disposed over the dielectric layer. The layer of active single-crystal silicon is then masked, patterned and selectively etched to yield the structure shown in FIG. 2, after which the dielectric layer is partially removed by selective chemical etching to release the structure. As shown in FIG. 3, the released MEMS structure 12 has a cantilevered portion 17 formed of Si and an anchor portion 19 formed of $SiO_2$.

The methodology depicted in FIGS. 1–3 suffers from a number of drawbacks, one being its reliance on partial chemical etching to define the anchor structure perimeter. Chemical etch rates can vary considerably from one product lot to another in an SOI fabrication scheme, due, for example, to variations in temperature, in the pH of the etching solution, and in the composition of the dielectric material being etched. In a fabrication scheme which relies on partial chemical etching, these variations in etch rates result in variations in the size of the anchor perimeter of the device. Consequently, in order to account for these variations and to ensure that a perimeter having a desired minimum circumference is achieved, SOI devices are typically designed with anchor perimeters that are significantly larger than would be necessary if etching were more predictable. However, the use of a perimeter that is larger than necessary is undesirable in that it increases the overall die area, and also leads to larger parasitic capacitance between the anchor and the substrate.

There is thus a need in the art for a method for producing a MEMS structure on a substrate, and particularly from an SOI wafer, such that the perimeter of the anchor portion of the structure (and hence the wafer size) can be minimized, is not affected by variations in etch rates, and does not vary significantly from one product batch to another. There is also a need in the art for a means for controlling etching in a process used to define the anchor structure and/or release the MEMS structure. There is further a need in the art for a method for making SOI MEMS devices in which parasitic capacitance is minimized. These and other needs are met by the methodologies and devices disclosed herein and hereinafter described.

SUMMARY OF THE INVENTION

In one aspect, a method for creating a MEMS structure is provided herein. In accordance with the method, a substrate is provided having a sacrificial layer disposed thereon and having a layer of silicon disposed over the sacrificial layer. A first trench is created which extends through the silicon layer and the sacrificial layer and which separates the sacrificial layer into a first region enclosed by the first trench and a second region exterior to the first trench. A first material is deposited into the first trench such that the first material fills the first trench to a depth at least equal to the thickness of the sacrificial layer. A second trench is created exterior to the first trench which extends through at least the silicon layer and exposes at least a portion of the second region of the sacrificial layer. The second region of the sacrificial layer is then contacted, by way of the second trench, with a chemical etching solution adapted to etch the sacrificial layer, said etching solution being selective to the first material. Since the material disposed in the first trench acts as a barrier to the etch, the timing of the etch is no longer critical, and MEMS structures may be produced which have anchor portions that do not vary significantly from one batch to another. Consequently, the anchor perimeter can be minimized, thereby minimizing parasitic capacitance and resulting in a reduction in die size.

In another aspect, a method for creating a MEMS structure is provided herein. In accordance with the method, a silicon substrate is provided having a layer of silicon dioxide disposed thereon and having a layer of silicon disposed on the layer of silicon dioxide. A first trench is created which extends through the layer of silicon and the layer of silicon dioxide and which separates the layer of silicon dioxide into a first region enclosed by the first trench and a second region exterior to the first trench. A first material is deposited into the first trench so as to separate the first and second regions from each other, said first material being selected from the group consisting of polysilicon and silicon nitride. A second trench is created exterior to the first trench which extends through at least the silicon layer and exposes at least a portion of the second region. The second region is then contacted, by way of the second trench, with a chemical etching solution adapted to etch silicon dioxide, said etching solution being selective to the first material.

In another aspect, a method for creating a MEMS structure is provided herein. In accordance with the method, a silicon substrate is provided, and a first trench is created in the substrate which encloses a first region of the substrate. A first material is deposited into the first trench so as to separate the first region of the substrate from the portion of the substrate exterior to the first trench, said first material being selected from the group consisting of polysilicon and silicon nitride. A second trench is created in the substrate which is exterior to the first trench. An etchant is then disposed in the second trench which etches polysilicon and which is selective to the first material.

These and other aspects are described in further detail below.

DETAILED DESCRIPTION

It has now been discovered that the above noted needs may be met by forming the anchor portion of a MEMS structure in such a way that it is protected during release by a material which is resistant to the etch used to achieve release of the structure. In the case of an SOI device, for example, this may be accomplished by forming a perimeter trench which defines the perimeter of the anchor portion of the device and which extends completely through the silicon and dielectric layers to the surface of the substrate. The trench is then filled with a material which is resistant to the etch used to achieve release of the structure, after which the structure is released by etching away a portion of the dielectric layer external to the perimeter trench. Since the fill material in the trench is resistant to the etch, the perimeter of the anchor portion is not significantly affected by the etch (that is, the dimensions of the anchor perimeter are not dependent on factors such as variations in temperature and in the pH of the etching solution), and does not vary significantly from one device to another. Consequently, the dimensions of the perimeter may be minimized without taking the etch into consideration.

Figure 1:
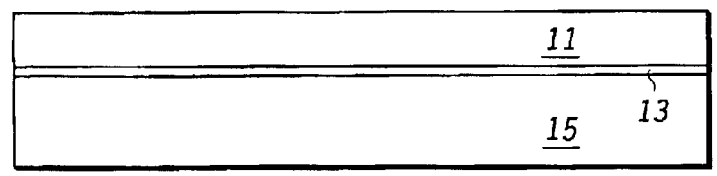
FIGS. 1–3 are illustrations of a prior art method for making a MEMS structure.
Figure 2:
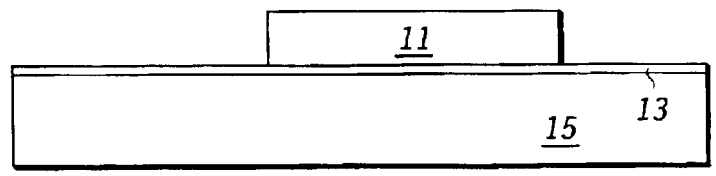
Figure 3:
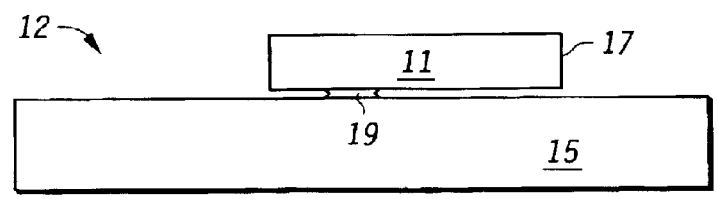
Figure 4:
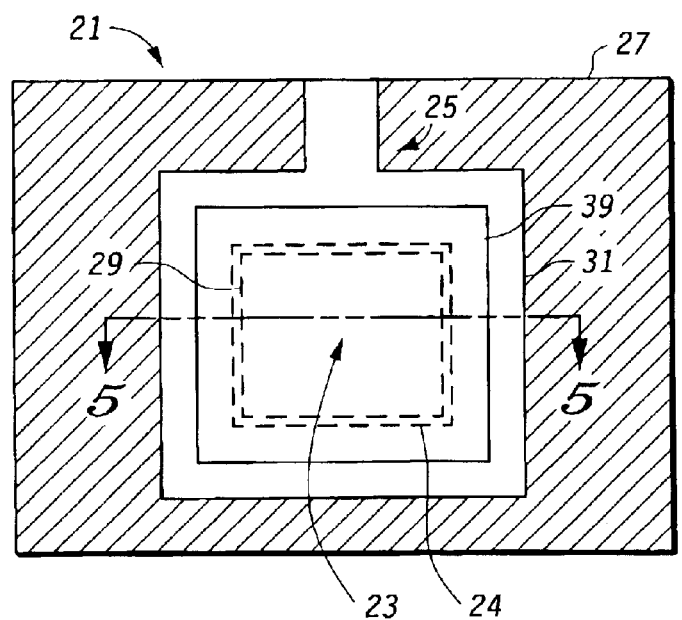
FIGS. 4–7 are illustrations of a MEMS device made in accordance with the teachings herein.

FIG. 4 is an illustration of a top view of one possible SOI MEMS structure 21 in accordance with the teachings herein. The structure, which includes an anchor portion 23 and a cantilevered portion 25, is depicted in FIG. 5 as it would appear after the perimeter trench 24 is filled but before removal of any portion of the dielectric layer 27.

Figure 5:
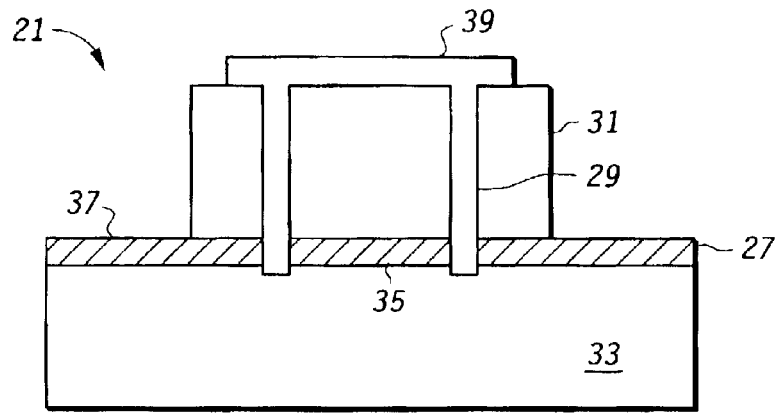

As seen in FIG. 5, which is a cross-sectional view taken along LINE 5—5 of FIG. 4, the material used to fill the trench forms a wall 29 which extends vertically through the silicon 31 and the dielectric layer 27 and (in this particular example) partially into the substrate 33. This wall separates the dielectric layer into an interior portion 35 which forms part of the anchor portion of the device, and an exterior portion 37 which is removed at least partially to achieve release of the structure. This material is selected to be resistant to the etch used to achieve release of the structure. For example, if the etch used for release is an aqueous HF solution, the material used to fill the trench may be polysilicon. In the particular example depicted in FIG. 5, a laterally extending portion 39 of the material used to fill the trench has been made to extend above the surface of the SOI to form a roof over the structure. In some applications, such a roof may provide additional protection for the anchor perimeter. For example, if release of the structure relies on immersion of the device in an aqueous HF solution, portions of exposed silicon in the structure will be etched, albeit at a much lower rate than the sacrificial oxide. Hence, in such applications, the roof prevents the silicon surface of the anchor portion from being etched, thereby maintaining its diameter.

Figure 6:
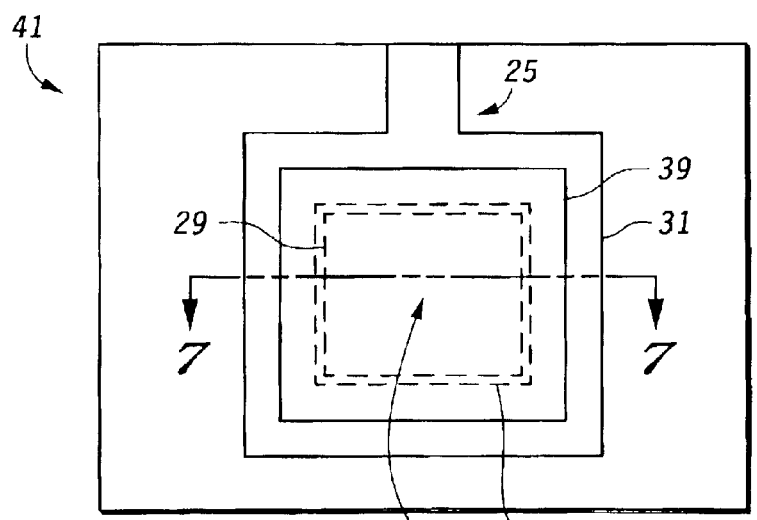
Figure 7:
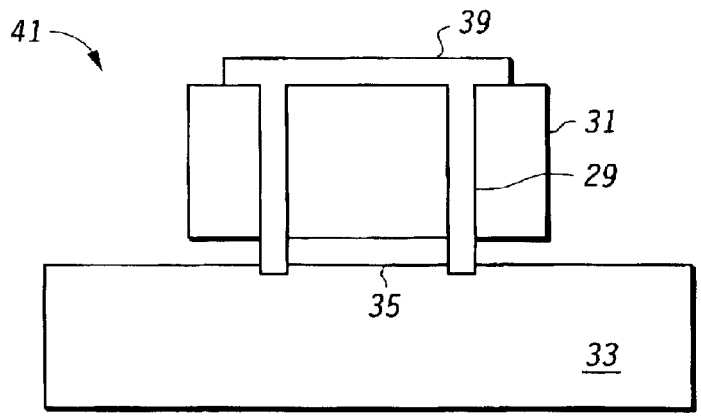

FIG. 6 is an illustration of a top view of the SOI MEMS structure 41 of FIGS. 4–5 after release of the structure. FIG. 7 is a cross-sectional taken along LINE 7—7 of FIG. 6. As shown in FIG. 7, since the interior portion 35 of the dielectric layer is separated from the remainder of that layer by the wall 29 formed from the trench fill material, it is not affected by the etch used to remove the exterior portion of the dielectric layer. Consequently, release of the structure may be achieved without the etch parameters (pH, etch duration, and so forth) having any significant effect on the size of the anchor perimeter. Hence, the anchor perimeter may be minimized.

Figure 8:
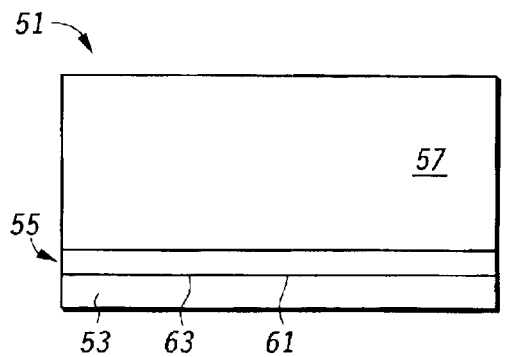
FIGS. 8–12 are illustrations of a method for making a MEMS device in accordance with the teachings herein.

FIGS. 8–12 illustrate one particular embodiment of a methodology that may be used to realize structures of the type depicted in FIGS. 4–7. As shown in FIG. 8, a structure 51 is provided which consists of a substrate 53 (typically silicon) having a sacrificial oxide layer 55 (typically silicon dioxide) disposed thereon, and having a layer of silicon 57 disposed on the sacrificial oxide layer. In a typical device, the silicon may have a thickness of about 20 microns and the sacrificial oxide layer may have a thickness of about 2 microns, though the present methodology is not limited to any particular layer thicknesses.

Figure 9:
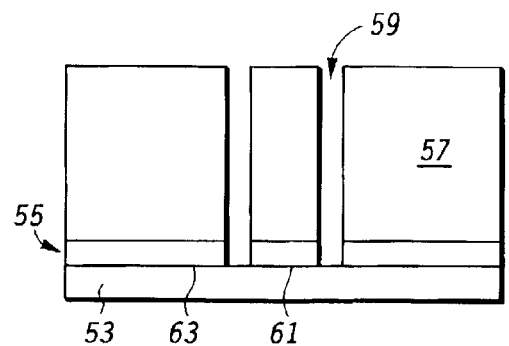

As shown in FIG. 9, a perimeter trench 59, which defines the perimeter of the anchor portion of the MEMS device, has been created in the structure through masking and etching steps (not shown). Since the figure is a cross-section, the trench appears as two separate structures; however, these structures are actually just opposite sides of a single perimeter trench that extends around the perimeter of the desired anchor portion of the device (see, e.g., the shape of the wall 29 in FIG. 4). The masking step typically involves applying a masking material to the structure and then exposing and developing the material to create a mask. The portion of the structure which is exposed by the mask is then subjected to an appropriate etching process, such as deep Reactive Ion Etching (RIE), to etch through the silicon, followed by an oxide etch to etch through the sacrificial oxide layer. The resulting trench divides the sacrificial oxide layer into an inner portion 61 which forms part of the anchor portion of the device, and an outer portion 63 which is removed in subsequent processing to release the SOI structure. The trench may also extend partially into the substrate 53.

Figure 10:
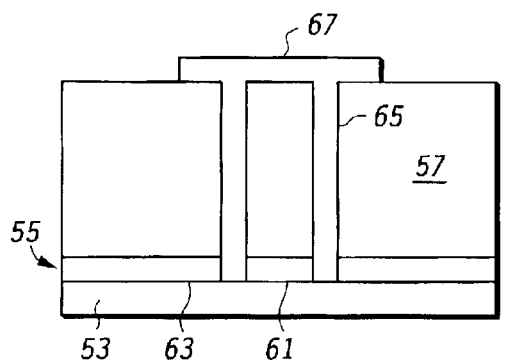

As shown in FIG. 10, polysilicon 65 is deposited over the trenched substrate through Chemical Vapor Deposition (CVD) or another suitable method. The polysilicon may be doped with boron or $POCl_3$ to reduce the electrical resistance of the polysilicon if desired for the intended end use of the device. After the polysilicon is deposited, it is masked (not shown) and patterned so that, in the resulting structure, the polysilicon fills the trench and extends laterally over a portion of the surface of the SOI so as to form a roof 67 over a portion of the surface of the SOI.

Figure 11:
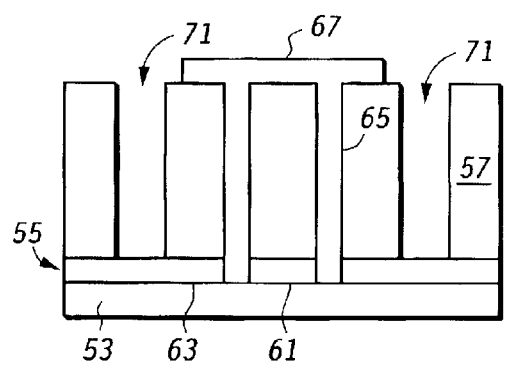

After polysilicon deposition and patterning of roof 67, an outline mask (not shown) is used in conjunction with a suitable etching technique such as deep reaction ion etching to create a second trench 71 outside of the perimeter of the first trench, as shown in FIG. 11. The second trench extends down to the sacrificial oxide layer. The chemistry of the etch and/or the etching conditions may be selected such that the sacrificial oxide layer acts as an etch stop during the creation of the second trench.

Figure 12:
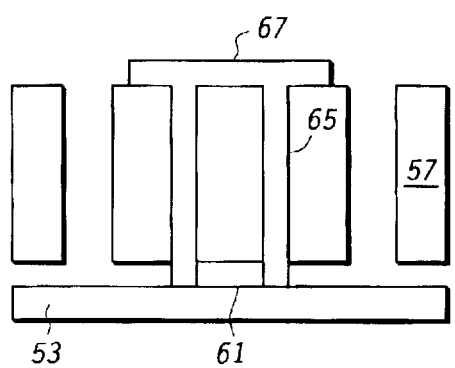

As shown in FIG. 12, the sacrificial oxide layer is removed with an HF etch to achieve release of the SOI structure (the portions of silicon shown on the left- and right-hand side of the figure form portions of adjacent cantilevered structures that are similar to the cantilevered structure shown in the center of the figure). Since the etch is selective to polysilicon, the anchor portion 61 of the sacrificial oxide layer is unaffected by the etch. Hence, the timing, temperature, pH, and other such etch factors are not particularly critical. For the same reason, a highly aggressive etch can be used here (e.g., by increasing the concentration of HF), thus dramatically reducing the etch time.

FIGS. 13–17 illustrate another embodiment of a methodology that may be used to realize structures of the type depicted in FIG. 7. Starting with the structure depicted in FIG. 9, a layer of polysilicon 83 is deposited in the trenches 59. Preferably, Low Pressure Chemical Vapor Deposition (LPCVD) is used for this purpose, since the low deposition temperatures it affords allows it to be used even with many temperature sensitive substrates. However, in many applications, other deposition techniques as are known to the art may also be used. The polysilicon is deposited at a slight excess (e.g., at a thickness of about 1.2 times the width of the trench) to ensure that the trenches are completely filled. The layer of polysilicon is then masked (not shown) and patterned so that the polysilicon remains only in the vicinity of the trench. A layer 81 of silicon nitride is then deposited over the filled trenches. Alternatively, the layer 81 may comprise polysilicon, in which case the trenches may be filled and the layer 81 may be formed in a single step.

Figure 13:
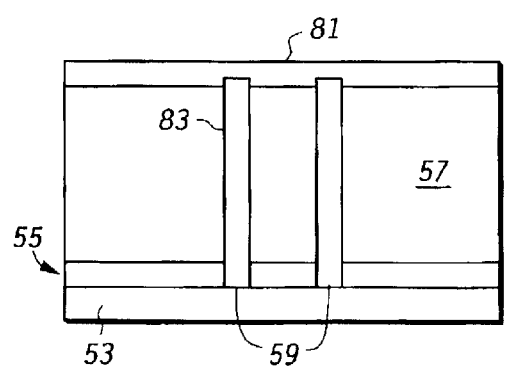
FIGS. 13–17 are illustrations of a method for making a MEMS device in accordance with the teachings herein.
Figure 14:
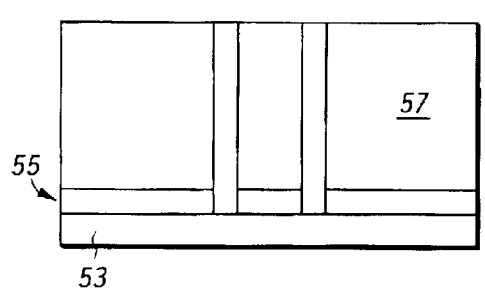
Figure 15:
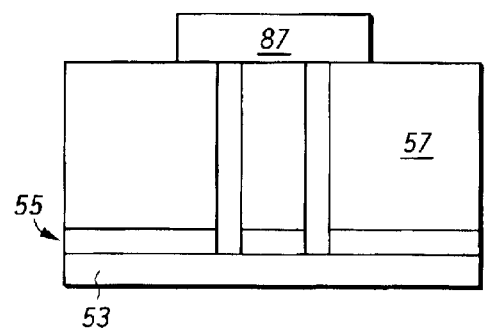

The structure depicted in FIG. 13 results, in which the material used to fill the trench extends slightly above the height of the trench. The layer 81 and the excess trench material is then etched back to the surface of the silicon to yield the structure depicted in FIG. 14. If layer 81 is silicon nitride, this can be achieved through the use of an etch having appropriate selectivity between silicon and silicon nitride. If layer 81 is polysilicon, the endpoint for the etch may be determined with the aid of spectroscopic techniques. As depicted in FIG. 15, a bond pad mask (not shown) is then used to vapor deposit a Cr—Au alloy over the mask opening to define a bond pad 87 in the vicinity of the trench.

Figure 16:
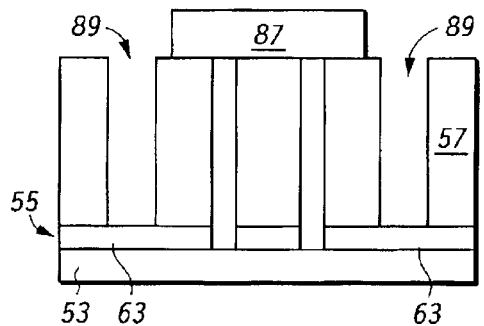
Figure 17:
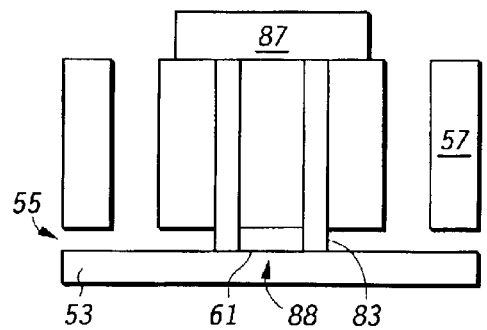

Next, as depicted in FIG. 16, an outline mask (not shown) is used to form a secondary trench 89 in the silicon layer 57 using a deep RIE, typically to a depth of 20 microns. The secondary trench extends to the sacrificial oxide layer 55. The structure is then released through an HF sacrificial oxide etch of the portion 63 of the sacrificial oxide layer exterior to the polysilicon to yield the structure depicted in FIG. 17. During the HF etch, the bond pad provides additional protection to the underlying silicon in much the same way as does the roof 67 in FIG. 10. As previously noted, the HF etch is selective to polysilicon, so that the interior portion 61 of the sacrificial layer is retained and serves as a component of the anchor structure 88.

As noted above, the structure depicted in FIG. 17 has an anchor structure 88 which is encapsulated in polysilicon. In some applications, however, it is desirable to use a dielectric anchor encapsulation material (that is, to create a device of the type depicted in FIG. 17 in which the polysilicon is replaced with a dielectric material such as silicon nitride, silicon oxynitride (SiON), an oxide, or a mixture of the two). In these applications, the sequence depicted in FIGS. 13–17 may be modified slightly using the dielectric material as the primary trench filling material. Thus, for example, rather than depositing polysilicon in the trenches as depicted in FIG. 13, a portion of dielectric material may be deposited by LPCVD or through other suitable methodologies to give a total deposition of about 1.2 times the width of the trench to ensure complete trench fill. The excess dielectric material may then be etched to the surface of the silicon in a manner analogous to that depicted in FIG. 14. The remainder of the processing steps are similar to those described in FIGS. 13–17, except that the etch used for release of the structure must be sufficiently selective to the dielectric material used as the primary trench filling material. If the dielectric material is nitride, an aqueous HF etch will exhibit sufficient selectivity for this purpose.

Figure 18:
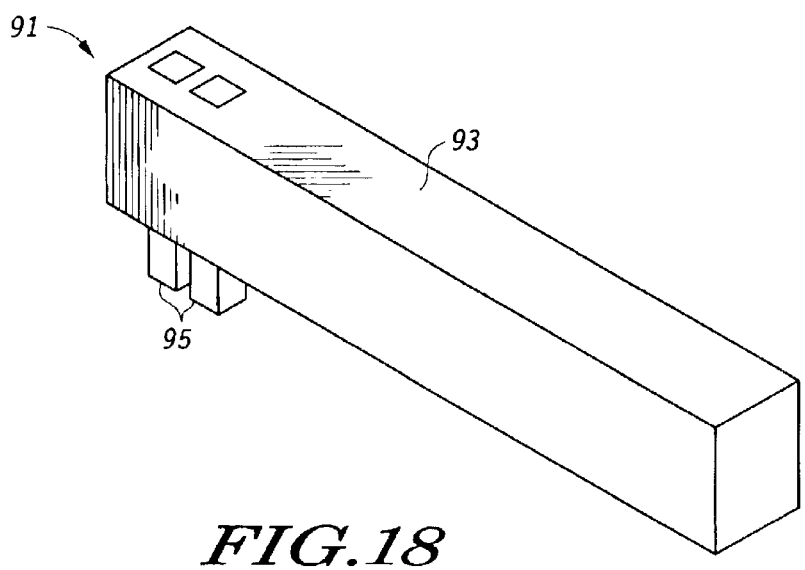
FIG. 18 is an illustration of an SOI cantilever utilizing a dual nitride anchor scheme.
Figure 19:
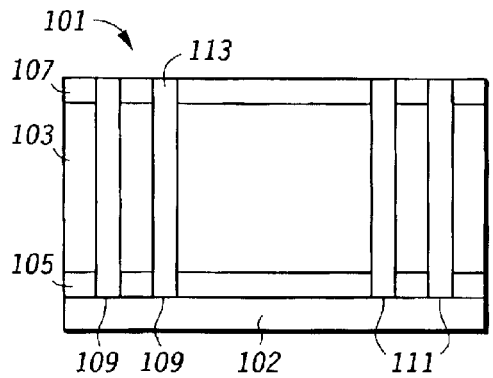
FIGS. 19–25 are illustrations of a method for making a MEMS device in accordance with the teachings herein.
Figure 20:
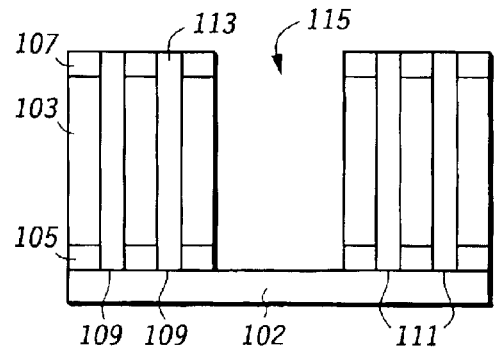
Figure 21:
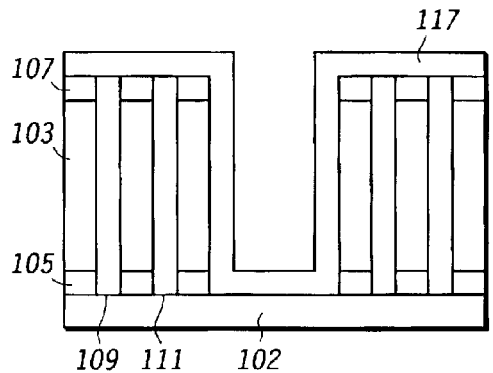
Figure 22:
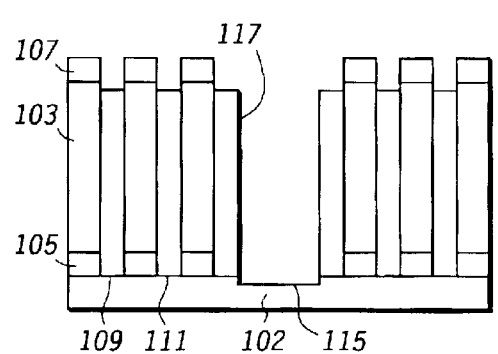
Figure 23:
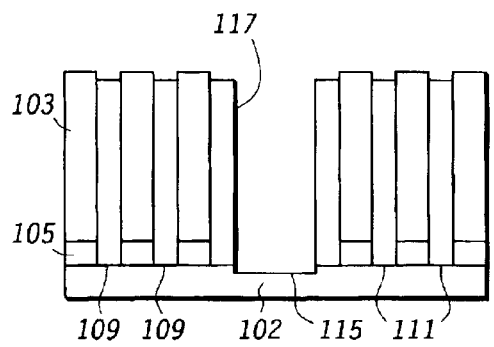

In some applications, in addition to using a dielectric material as the primary trench filling material, it is also possible to use certain dielectric materials (whether or not they are deposited by LPCVD) as the anchor portion without encapsulating the anchor portion, provided that the etch used to release the structure is selective to the dielectric material. One example of a device having this type of anchor portion is depicted in FIG. 18. As shown, the device 91 features a cantilever 93 supported by dual nitride anchors 95 (the substrate is not shown), though in some embodiments a single nitride anchor may be used. An HF etch, which is selective to nitride, can be used to achieve release of this type of structure. The nitride anchors are preferably spaced about 2 to 4 microns apart, and are typically about 2 microns wide. Preferably, the anchors are cubic to simplify the geometric layout. The use of LPCVD to create anchors of this type is particularly advantageous in that the anchors so fabricated have low internal stress and are sufficiently stiff that they can be neglected in calculating beam spring constants for the cantilever.

In some MEMS applications, it is desirable to create a cantilevered structure that is provided with a substrate contact. Such a structure may be useful, for example, in applications where bootstrapping is desirable. In such a structure, the principles described herein can be used to protect the anchor portion of the device during release.

FIGS. 19–24 illustrate one possible process flow that could be used to realize an SOI cantilevered structure of this type. The process depicted begins with the structure 101 depicted in FIG. 19. This structure includes a silicon substrate 102 having formed thereon a silicon layer 103 which is separated from the substrate by a first sacrificial oxide layer 105, and which has a second sacrificial oxide layer 107 disposed thereon. First 109 and second 111 trenches are formed which extend through the silicon layer and the first and second sacrificial oxide layers and which are filled with polysilicon 113. The structure of FIG. 19 may be fabricated using the methodologies previously described to create the first and second trenches and fill them with polysilicon.

Next, an anchor mask (not shown) is used in conjunction with deep RIE (typically to a depth of about 20 microns) oxide etching (for both the first and second sacrificial oxide layer and silicon layer 103) to form a central trench 115 in the SOI which extends down to the silicon substrate. The structure depicted in FIG. 20 results. A layer of polysilicon 117 is then deposited over the entire structure through LPCVD, thus giving rise to the structure depicted in FIG. 21. The structure is then subjected to polysilicon etch-back to give the structure depicted in FIG. 22 in which the sidewalls of the central trench 115 are lined with polysilicon 117.

Figure 24:
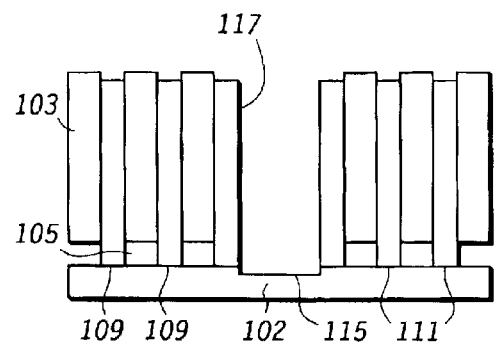
Figure 25:
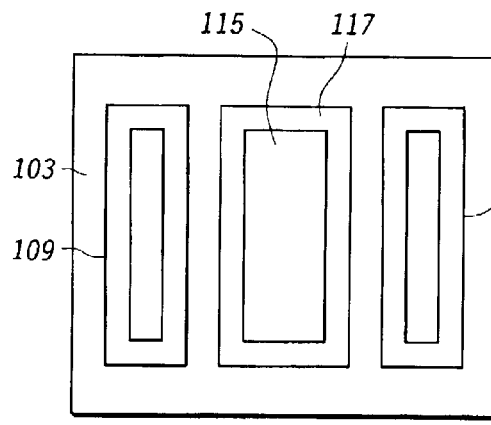

The second sacrificial oxide layer 107 is then stripped, and a layer of oxide (not shown) is deposited over the structure to a thickness of about 1.5 kÅ. The oxide layer is patterned through RIE and is used as an oxide mask in a deep RIE of the silicon substrate (typically to a depth of about 20 microns). The oxide mask is then stripped and the remaining polysilicon is doped with boron or phosphorous to yield the structure in FIG. 23. Release of the structure is effected through an HF etch of the sacrificial oxide layer, as shown in FIG. 24. A top view of the structure of FIG. 24 is shown in FIG. 25. As seen in FIGS. 24 and 25, the substrate in these structures is exposed by way of the central trench 120.

FIGS. 26–30 illustrate still another method for making SOI devices having encapsulated anchors in accordance with the teachings herein. The process flow illustrated in FIGS. 26–30 is particularly useful for making high impedance devices, given the high electrical resistance of the nitride used to line the perimeter trench.

Figure 26:
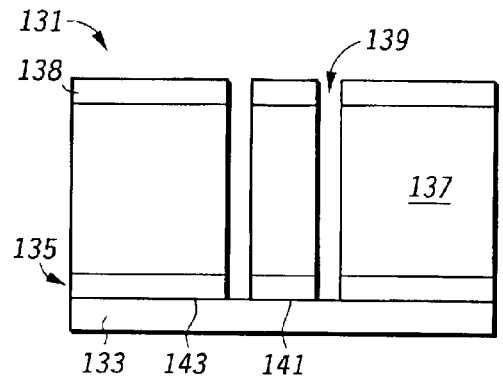
FIGS. 26–30 are illustrations of a method for making a MEMS device in accordance with the teachings herein.
Figure 27:
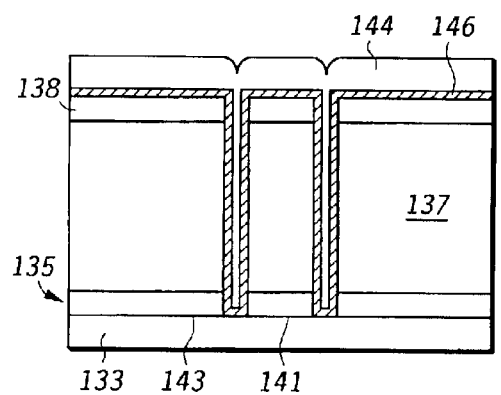
Figure 28:
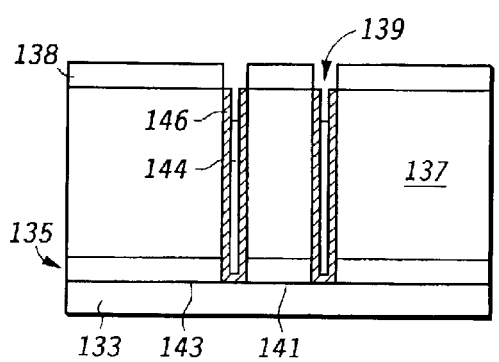

As shown in FIG. 26, a structure 131 is provided which consists of a silicon substrate 133 having a sacrificial oxide layer 135 disposed thereon, and having a silicon layer 137 disposed on the sacrificial oxide layer. The silicon layer has a thickness of about 20 microns. A 1.5 kA anchor mask 138 formed of oxide is disposed on the structure. The anchor mask has been patterned to create an aperture therein, and a trench 139 has been created in the aperture by subjecting the exposed region in the aperture to deep RIE (typically to a depth of about 20 microns). The trench, which has been extended through the sacrificial oxide layer (which is typically about 2 microns thick) by a reactive ion etch process step, separates the sacrificial oxide layer into an inner portion 141, which forms part of the anchor portion of the device, and an outer portion 143 which is removed in subsequent processing to release the SOI structure.

A layer of nitride 146 is deposited over the structure of FIG. 26 through LPCVD or another suitable technique. A layer of polysilicon 144 is then deposited over the layer of nitride, again by LPCVD or another suitable technique, resulting in the structure depicted in FIG. 27. The polysilicon layer is sufficiently thick (typically about 2 microns) to fill the trench (in some variations of this method, a layer of oxide may be deposited over the nitride layer in place of polysilicon). The nitride and polysilicon layers (or, as the case may be, the nitride and oxide layers) are then subjected to etch back (typically through separate etch steps) to yield the structure shown in FIG. 28 in which the nitride layer terminates near the opening of the trench 139 and the polysilicon 144 (or, as the case may be, the oxide) terminates somewhat below the nitride layer.

Figure 29:
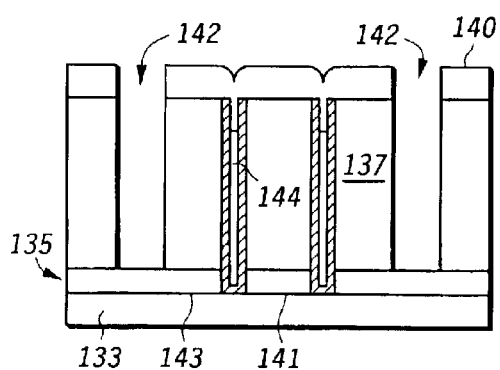
Figure 30:
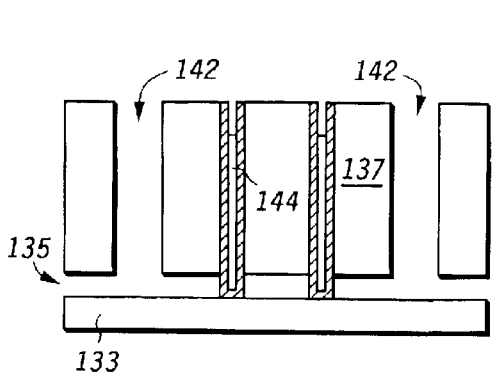
Figure 31:
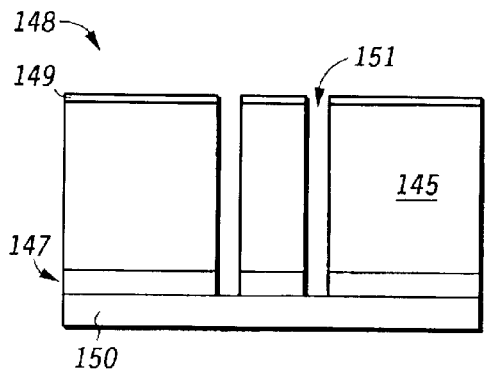
FIGS. 31–36 are illustrations of a method for making a MEMS device in accordance with the teachings herein.

Next, as shown in FIG. 29, the oxide anchor mask is stripped, and an outline oxide hard mask 140 is deposited (typically to a depth of about 1.5 kA) and patterned through RIE. The outline hard mask is then used in deep RIE (typically to a depth of about 20 microns) to define a second trench 142. The structure is then subjected to an HF sacrificial oxide etch to achieve release, as shown in FIG. 30.

Another method for making high impedance devices is illustrated in FIGS. 31–36. The process begins with the structure of 148 depicted in FIG. 31, which comprises a substrate 150, a first oxide layer 147, a silicon layer 145, and a second oxide layer 149. A trench 151 extends through the silicon layer and first and second oxide layers.

Figure 32:
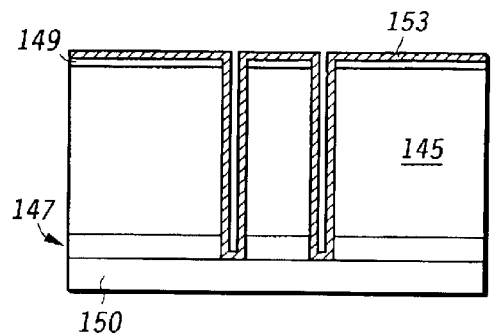

As shown in FIG. 32, a nitride layer 153 (typically about 1.5 kA in thickness) is deposited via LPCVD or by other suitable means over the exposed surfaces (including the trench surfaces) of the device and over the first oxide layer 149. A mask (not shown) is then used to selectively etch back the first oxide layer 138 and the nitride layer 153 to yield the structure shown in FIG. 33.

Figure 33:
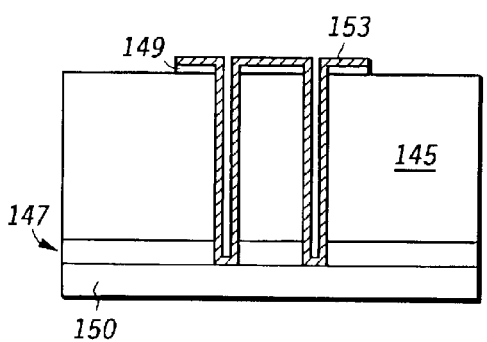
Figure 34:
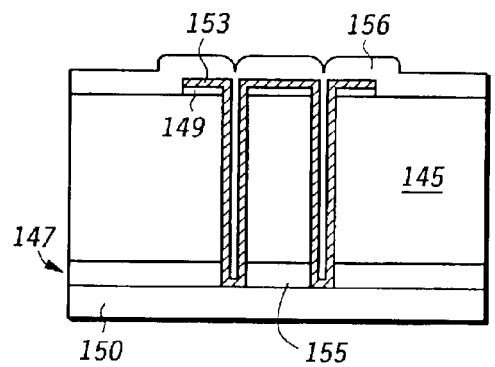

LPCVD or another suitable means is then used to form a polysilicon layer 156 over the structure of FIG. 33 as shown in FIG. 34. The polysilicon layer is doped with boron during deposition, which has the effect of increasing the conductivity of the polysilicon while at the same time improving its resistance to the silicon etch used subsequently to define trenches in the structure.

Figure 35:
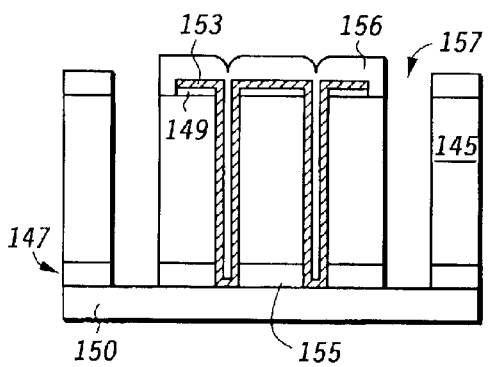
Figure 36:
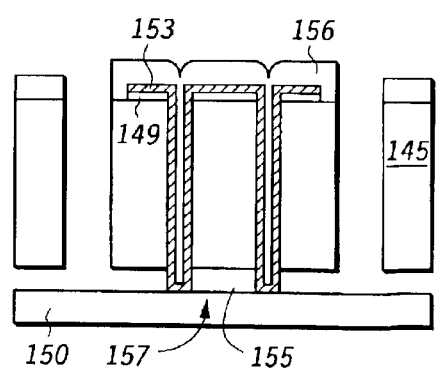
Figure 37:
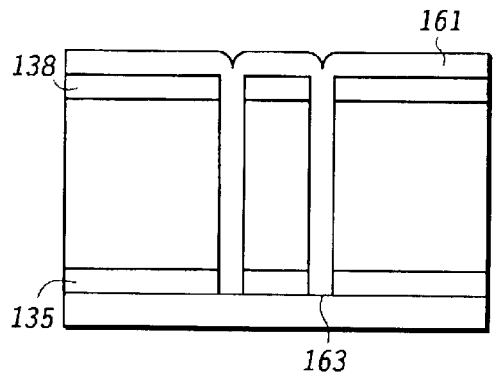
FIGS. 37–40 are illustrations of a method for making a MEMS device in accordance with the teachings herein.
Figure 38:
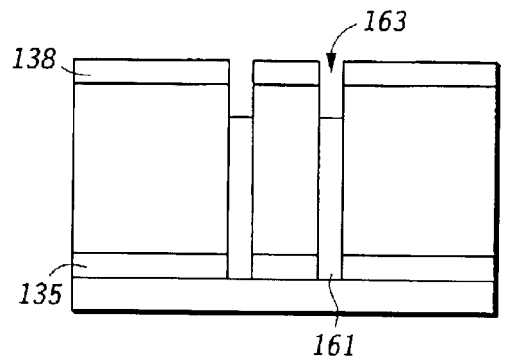

Next, the polysilicon layer 156 is masked and the polysilicon layer and underlying silicon 145 are selectively etched to form a second trench 157 in the structure which extends down to the sacrificial oxide layer 147, as depicted in FIG. 35. The exposed oxide layer is then etched with HF to achieve release of the structure, as shown in FIG. 36. Since the nitride layer 153 lining the first trench is resistant to the HF etch, a portion 155 of the oxide layer remains after the etch to form part of the anchor structure 157.

Yet another method for making a high impedance device is depicted in FIGS. 37–40. Starting with the structure of FIG. 26, LPCVD is used for polysilicon deposition to yield the structure of FIG. 37 in which a layer of polysilicon 161 (typically about 2 microns thick) is disposed over the exposed surfaces of the structure and over the oxide layer 138. The polysilicon also fills the trench 163. RIE is then used for a polysilicon etch back to yield the structure of FIG. 38 in which the polysilicon 161 is removed from the upper portion of the trench 163 (i.e., it is partially recessed). A high temperature anneal can be used to auto-dope the polysilicon deposited in trench 163 via the adjacent highly doped SOI and silicon substrate.

Figure 39:
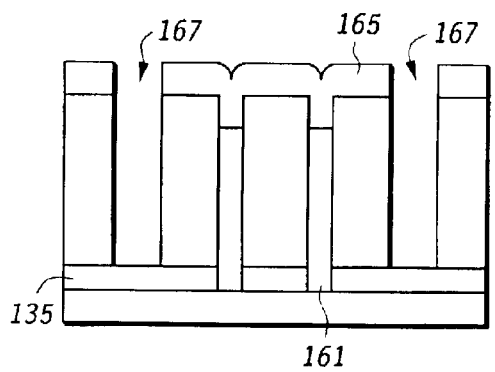
Figure 40:
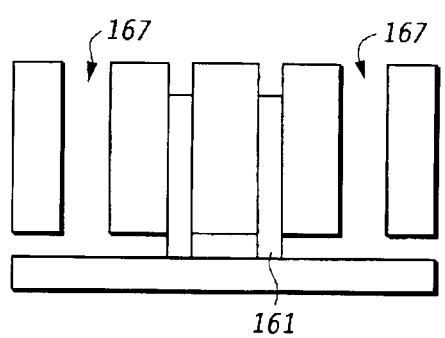

As shown in FIG. 39, the first oxide layer is then stripped, and a layer of oxide (e.g., 1.5 microns in thickness) is deposited and patterned through RIE to form an outline oxide hard mask 165. The structure is then subjected to deep RIE, typically to a depth of about 20 microns, to define a perimeter trench 167. The exposed sacrificial oxide layer 135 is then etched with HF to achieve release of the structure, as shown in FIG. 40. The etch also removes the outline oxide hard mask.

Figure 41:
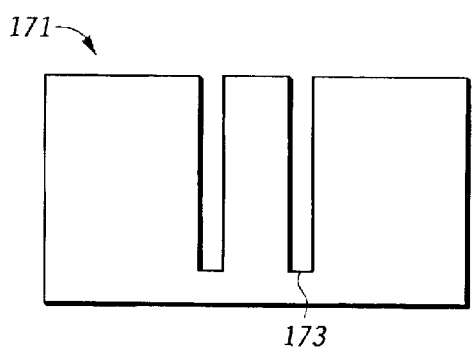
FIGS. 41–46 are illustrations of a method for making a MEMS device in accordance with the teachings herein.

The previously described methods are surface micromachining methods. However, the principles disclosed herein can also be applied to bulk silicon micromachining, as illustrated in FIGS. 41–46. The structure 171 in FIG. 41 is formed by doping a silicon substrate with boron at a diffusion depth of about 15 microns and then using an anchor mask (not shown) to selectively etch a perimeter trench 173 in the substrate through deep RIE etching. The trench has a depth of about 80 microns.

Figure 42:
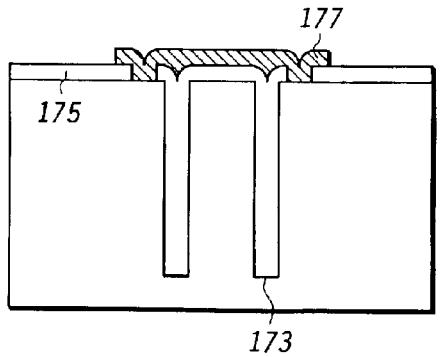
Figure 43:
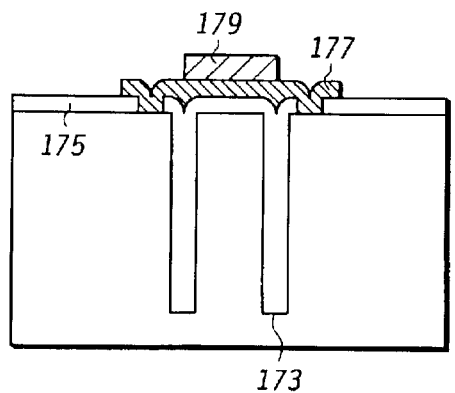

Next, the structure of FIG. 42 is formed by depositing a layer of oxide 175 via LPCVD over the structure and filling the trench, patterning the layer of oxide, and then, with the use of a mask (not shown), depositing a layer of polysilicon over the structure, doping the polysilicon with boron, and using a polysilicon mask (not shown) to define a polysilicon cap layer 177. The structure in FIG. 43 is then formed by depositing a photoresist, patterning it, and depositing metal 179, followed by lift off.

Figure 44:
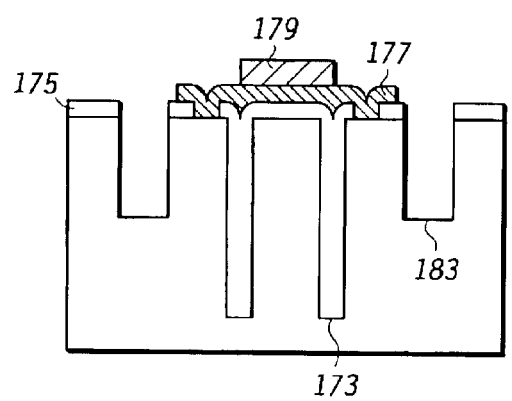
Figure 45:
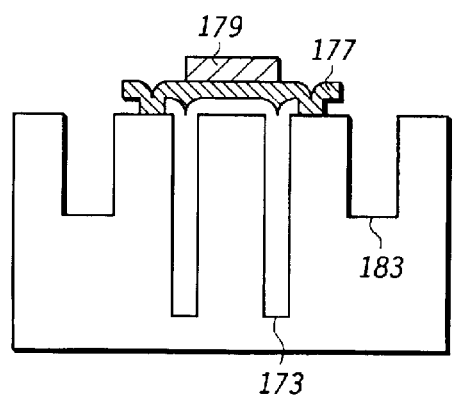
Figure 46:
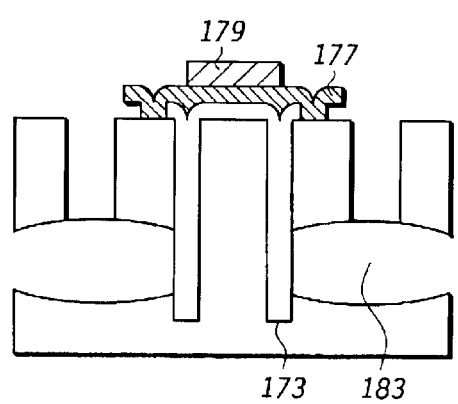

The structure in FIG. 44 is then attained by patterning layer 175 and performing silicon bulk etching with the use of patterned layer 175 as a mask to form a second trench 183. As shown in FIG. 45, the unprotected portions of the silicon oxide layer are then removed by a wet HF etch. The structure shown in FIG. 46, in which a well 183 is formed around the anchor portion, is then achieved by etching with TMAH (TetraMethyl Ammonium Hydroxide) or EDP (ethylenediamene pyrocatecol), thus effecting release of the structure.

Methods have been provided herein for producing a MEMS structure on a substrate, and particularly on an SOI or bulk silicon wafer, in which the anchor structure is encapsulated in a material resistant to the etch used to achieve release of the structure. These methods allow the perimeter of the anchor (and hence the wafer size) to be minimized, and further ensure that the anchor perimeter does not vary significantly from one product batch to another. Devices can be made in accordance with these methods whose parasitic capacitances are minimized.

The above description of the invention is illustrative, and is not intended to be limiting. It will thus be appreciated that various additions, substitutions and modifications may be made to the above described embodiments without departing from the scope of the present invention. For example, in many embodiments of the methodologies and devices disclosed herein, the perimeter trench is shown as terminating at the substrate. However, it will be appreciated that, in many applications, the perimeter trench may be made to extend into the substrate. Moreover, the thicknesses and compositions of the various layers, and the etches employed, are not limited to those specifically mentioned. Accordingly, the scope of the present invention should be construed solely in reference to the appended claims.

What is claimed is:

1. A method for creating a MEMS structure, comprising the steps of:
   providing a silicon substrate;
   creating a first trench in the substrate which encloses a first region of the substrate;
   depositing a first material into the first trench so as to separate the first region of the substrate from the portion of the substrate exterior to the first trench, said first material being selected from the group consisting of polysilicon and silicon nitride;
   depositing a second material into the first trench, said second material being distinct from said material;
   creating a second trench in the substrate which is exterior to the first trench; and
   disposing an etchant in the second trench which etches the substrate and which is selective to the first material.

2. The method of claim 1, wherein the first material is deposited and patterned such that it is disposed in and extends beyond the first trench.

3. The method of claim 1, wherein the etchant is selected from the group consisting of TMAH and EDP.

4. The method of claim 1, wherein the step of disposing the etchant in the second trench releases a portion of the substrate so as to form a cantilever in a MEMS structure.

5. A method for creating a MEMS structure, comprising the steps of:
   providing a silicon substrate having a layer of silicon dioxide disposed thereon and having a layer of silicon disposed on the layer of silicon dioxide;
   creating at least one aperture which extends through the layer of silicon and the layer of silicon dioxide;
   depositing a first material comprising nitride in the at least one aperture, thereby defining an anchor portion;
   depositing a second material over the first material so as to define a cantilevered portion; and
   etching the silicon oxide with a chemical etching solution which is selective to the first material.

6. The method of claim 5, wherein the first material is deposited by LPCVD.

7. The method of claim 5, wherein the chemical etching solution comprises HF.

8. The method of claim 5, wherein the silicon oxide is etched until the cantilevered portion is released.

9. A method for creating a MEMS structure, comprising the steps of:
   providing a substrate having a sacrificial layer disposed thereon and having a semiconductor layer disposed over the sacrificial layer;
   creating a first trench which extends through the semiconductor silicon layer and the sacrificial layer and which separates the sacrificial layer into a first region enclosed by the first trench and a second region exterior to the first trench;
   depositing a first material into the first trench such that the first material covers the portion of the sacrificial layer exposed by the first trench;
   depositing a second material into the first trench, the second material being distinct from the first material;
   creating a second trench exterior to the first trench which extends through at least the semiconductor layer and exposes at least a portion of the second region of the sacrificial layer; and
   contacting the second region of the sacrificial layer, by way of the second trench, with a chemical etching solution adapted to etch the sacrificial layer, said etching solution being selective to the first material.

10. The method of claim 9, wherein the first trench is lined with the first material.

11. The method of claim 9, wherein the first material is polysilicon.

12. The method of claim 9, wherein the first material is silicon nitride.

13. The method of claim 12, wherein the second material is polysilicon.

14. The method of claim 9, wherein the sacrificial layer comprises silicon dioxide.

15. The method of claim 9, wherein the step of contacting the second region of the sacrificial layer with the chemical etching solution releases a portion of the semiconductor layer so as to form a cantilever in a MEMS structure.

16. The method of claim 9, wherein both the substrate and the semiconductor layer comprise silicon, and wherein the sacrificial layer comprises silicon dioxide.

17. A method for creating a MEMS structure, comprising the steps of:
   providing a substrate having a sacrificial layer disposed thereon and having a semiconductor layer disposed over the sacrificial layer;
   creating a first trench which extends through the semiconductor silicon layer and the sacrificial layer and which separates the sacrificial layer into a first region enclosed by the first trench and a second region exterior to the first trench;
   depositing a first material into the first trench such that the first material covers the portion of the sacrificial layer exposed by the first trench;
   creating a second trench exterior to the first trench which extends through at least the semiconductor layer and exposes at least a portion of the second region of the sacrificial layer; and
   contacting the second region of the sacrificial layer, by way of the second trench, with a chemical etching solution adapted to etch the sacrificial layer, said etching solution being selective to the first material;
   wherein the first material is deposited such that extends beyond the first trench.

18. The method of claim 17, wherein the first material is polysilicon.

19. The method of claim 17, wherein the first material is silicon nitride.

20. The method of claim 17, further comprising the step of forming a bond pad over the first material.

21. The method of claim 17, wherein the first trench is lined with the first material, and wherein the first trench is further filled with a second material.

22. The method of claim 21, wherein the first material is silicon nitride and wherein the second material is polysilicon.

23. The method of claim 17, wherein the sacrificial layer comprises silicon dioxide.

24. The method of claim 17, wherein the step of contacting the second region of the sacrificial layer with the chemical etching solution releases a portion of the semiconductor layer so as to form a cantilever in a MEMS structure.

25. The method of claim 17, wherein both the substrate and the semiconductor layer comprise silicon, and wherein the sacrificial layer comprises silicon dioxide.

26. The method of claim 17, wherein the first material is deposited such that it fills the first trench.

* * * * *